United States Patent [19]
Aiello et al.

[11] Patent Number: 5,830,783
[45] Date of Patent: Nov. 3, 1998

[54] MONOLITHIC SEMICONDUCTOR DEVICE HAVING AN EDGE STRUCTURE AND METHOD FOR PRODUCING SAID STRUCTURE

[75] Inventors: Natale Aiello, Catania; Atanasio LaBarbera, Palermo; Salvatore Leonardi, ACI Sant'Antonio, all of Italy

[73] Assignee: Consorzio per la Ricerca sulla Microeletrronica nel Mezzogiorno, Catania, Italy

[21] Appl. No.: 758,571

[22] Filed: Dec. 3, 1996

[30] Foreign Application Priority Data

Dec. 19, 1995 [EP] European Pat. Off. .............. 95830524

[51] Int. Cl.$^6$ ...................... H01L 21/332; H01L 21/8236
[52] U.S. Cl. ........................................... 438/140; 438/275
[58] Field of Search .................... 438/140, 275; 257/355, 409, 500, 501, 502

[56] References Cited

U.S. PATENT DOCUMENTS 5,168,340  12/1992  Nishimura ................................ 257/409
5,446,300   8/1995  Amato et al. ........................... 257/500
5,567,968  10/1996  Tsuruta et al. .......................... 257/355

FOREIGN PATENT DOCUMENTS

A-0 307 032   3/1989  European Pat. Off. ........ H01L 21/72
A-0 420 672   4/1991  European Pat. Off. ........ H01L 21/76
A-0 509 183  10/1992  European Pat. Off. ........ H01L 27/08
A-0 632 503   1/1995  European Pat. Off. ........ H01L 29/06

*Primary Examiner*—Brian Dutton
*Attorney, Agent, or Firm*—Wolf, Greenfield & Sacks, P.C.; James H. Morris

[57] ABSTRACT

A monolithic semiconductor device having an edge structure that facilitates integrating high power devices an logic devices on the same substrate. The semiconductor device includes on a substrate of a first type of doping, a control region of a second type of doping, which is provided with an edge region, and a power region of a second type of doping. In the edge region, at least one channel is provided which is adapted to divide the edge region into regions that are electrically isolated from each other, the region at the channel being covered with a field plate. A method for producing such an edge structure in combination with the production execution of the monolithic device is also disclosed herein.

3 Claims, 4 Drawing Sheets

MONOLITHIC SEMICONDUCTOR DEVICE HAVING AN EDGE STRUCTURE AND METHOD FOR PRODUCING SAID STRUCTURE

BACKGROUND OF THE INVENTION

1. Field of the Invention

The present invention relates to a monolithic semiconductor device having an edge structure and a method for producing said structure.

2. Discussion of the Related Art

In integrated circuits wherein a power device and a logic controller are integrated in the same chip, the need arises to provide, inside the control region (linear region), a division of the substrate voltage, for example to obtain a power supply from said voltage.

The voltage divider used for this purpose is provided by means of a resistor connected between the substrate and the control region. If the device operates at medium to low substrate voltages, the divider is easily provided, since neither edge structures nor flat termination structures are required.

However, a problem arises when the device instead operates at high substrate voltages (>600V) where it is therefore necessary to use as an edge a high-resistivity ring that surrounds the entire device. FIG. 1 shows the associated problems. This figure shows a P-type region that provides a resistor 4, a control region 1 with its edge structure 2, and an equipotential ring 5 that is at the potential of the substrate. The edge structure of the control region is provided by means of a P-type ring that is in contact with the isolation region between the control region and the power region.

Since the high-voltage resistance is of the same type as the edge (P type), the problem arises of passing through said edge without altering the features of said divider. This is due to the fact that in electrical terms, edge crossing is equivalent to placing a resistor between the end of the high-voltage resistor and ground (since the edge is usually ground-biased).

FIG. 2 shows this problem in the case in which one wishes to obtain a power supply from the substrate voltage. This figure shows that the voltage at the node A is not produced by the voltage across the Zener diode 103, but rather by a division of the voltage between the high-voltage resistor 4 and the edge resistor 102, and this is not desirable.

To avoid affecting the value of the voltage on the node A, the edge ring should have an extremely high resistivity, which is obtained by acting on the doping of the ring to avoid current losses, but this is not practical, since the doping of the ring determines the amount of depletion of the annular region and therefore its operation. There are therefore two distinctly contrasting requirements: to provide a very high resistivity of the ring without, at the same time, altering the doping level of the ring.

Junctions produced in planar technology have, in inverse biasing conditions, a different distribution of the electric field between the bulk region and the edge region. In the latter region, the electric field can be reached at a biasing voltage that is lower than the breakdown voltage in the bulk region.

Various technological solutions have been used to reduce the high electrical field value in the edge region, all trying to appropriately control the depletion of the doped region that is adjacent to the junction to be protected, so as to prevent local increases in the electrical field from causing early breakdowns with respect to the breakdown in the flat junction region. The various solutions include so-called field plates which, if sized appropriately above the edge region, allow the guiding of the depletion region gradually from the bulk of the device towards the surface regions. Biplanar or triplanar structures can improve the extension of the depletion region.

Other methods for guiding the depletion region include using high-resistivity rings placed in contact with the main junction to be protected, so as to force said depletion region to extend over wider regions and thus expand spatial charge distribution. These structures become necessary for devices that must withstand high voltages, where a plurality of rings, arranged in order of increasing resistivity, can be used for this purpose.

In monolithic semiconductor devices, the isolation of components that constitute the logic circuits and the power components can be provided with the junction isolation method. The isolation region delimits and isolates the wells for containing low-voltage and high-voltage components. For monolithic devices including integrated structures that must withstand high substrate voltages, the edge structure is provided in a position that is adjacent to the outer isolation region. This termination region surrounds the outer isolation region and delimits the entire structure inside which the low-voltage and high-voltage components are integrated.

The production of a high-voltage resistor entails the occupation of a large silicon area since, in order to avoid the above mentioned drawbacks, it is necessary to terminate the resistor outside the P region used for the termination region. This requires providing an edge that is similar to the one used to terminate the device, and the two terminations need to be at such a distance so as to ensure electrical isolation at the operating voltage. Furthermore, the connection between the resistor and the control region should be performed by means of a field plate that passes through a high-voltage epitaxial region. Voltage withstanding ability is therefore determined by the thickness of the underlying oxide.

Another drawback entailed by the use of the P-type edge ring is that it places a resistor between the P-type region that provides the control region and the P-type region that provides the base of the power device. In other words, since the isolation region is normally connected to the ground, a resistor is placed between the base of the power device and the ground, with consequent loss of current. This drawback is shown in FIG. 5.

SUMMARY OF THE INVENTION

A principal aim of the present invention is therefore to provide a monolithic semiconductor device having an edge structure, which allows a division of the substrate voltage even in case of high operating voltages.

Within the scope of this aim, an object of the present invention is to provide a monolithic semiconductor device having an edge structure, which allows giving the edge ring an infinite resistivity without affecting the doping of said ring. Another object of the present invention is to provide a monolithic semiconductor device having an edge structure which reduces silicon area occupation. Another object of the present invention is to provide a monolithic semiconductor device having an edge structure which eliminates current losses. A further object of the present invention is to provide a method for producing an edge structure according to the present invention that integrates low-voltage and high-voltage components in monolithic semiconductor devices. Another object of the present invention is to provide a monolithic semiconductor device having an edge structure and a method for producing said structure that are highly reliable, relatively easy to provide, and have competitive costs.

This aim, these objects, and others which will become apparent hereinafter are achieved by a monolithic semiconductor device having an edge structure, which comprises, on a substrate of a first type of doping, a control region of a second type of doping, which is provided with an edge region, and a power region of a second type of doping, characterized in that in said edge region at least one channel is provided which is adapted to divide said edge region into regions that are electrically isolated from each other, the region at said at least one channel being covered with a field plate.

BRIEF DESCRIPTION OF THE DRAWINGS

Further characteristics and advantages of the invention will become apparent from a preferred, non-limiting embodiment of the present invention described by way of example with reference to the accompanying drawings, in which.

DETAILED DESCRIPTION

Figure 1:
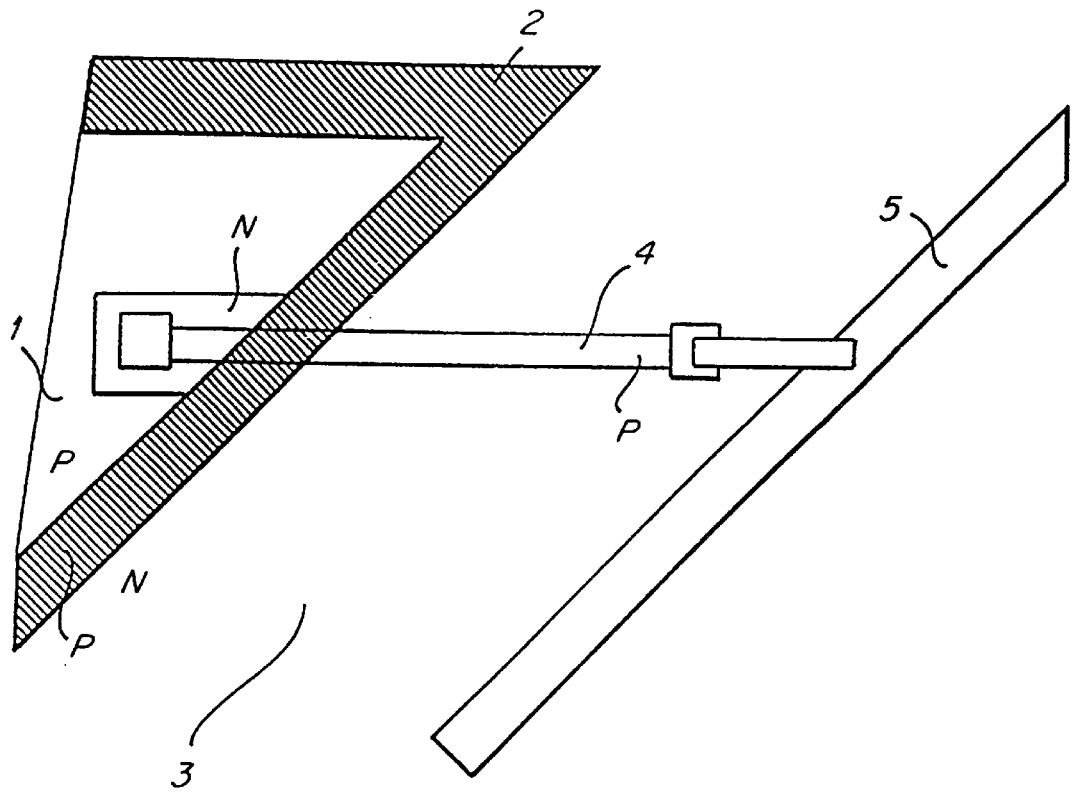
FIG. 1 shows a voltage divider for a monolithic semiconductor device having a high operating voltage, executed according to a conventional method that is generally used in cases of a medium-low operating voltages.

FIGS. 1 to 5 show conventional arrangements. In particular, FIG. 1 shows a voltage divider executed by connecting a high-voltage resistor 4 between a control region 1 provided with an edge 2 and an equipotential ring 5, which is at the same potential as the substrate.

Figure 2:
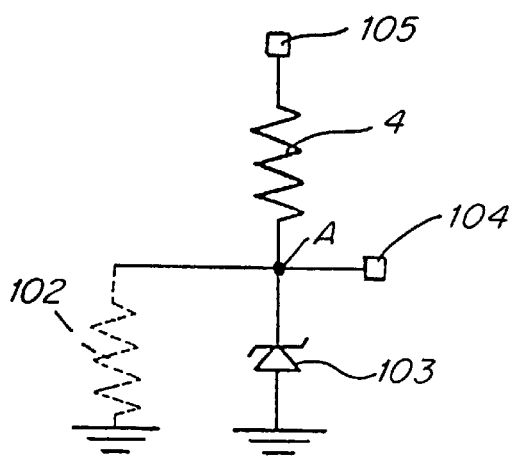
FIG. 2 is an electrical diagram of the device shown in FIG. 1, and which is also used to describe an embodiment of the present invention.

FIG. 2 is a view of the circuit embodiment of FIG. 1 when a supply voltage is drawn from the substrate of the device, by means of a voltage division. In this figure, the reference numeral 4 designates the high-voltage resistor, the reference numeral 102 designates the edge resistor, 103 designates the Zener diode, 104 designates the substrate voltage division, and 105 designates the connection to the substrate. To avoid affecting the value of the voltage at the node A, the edge resistor 102 should have an extremely high resistance, but this conflicts with the need to avoid modifying the doping level that determines the operation of the device.

Figure 3:
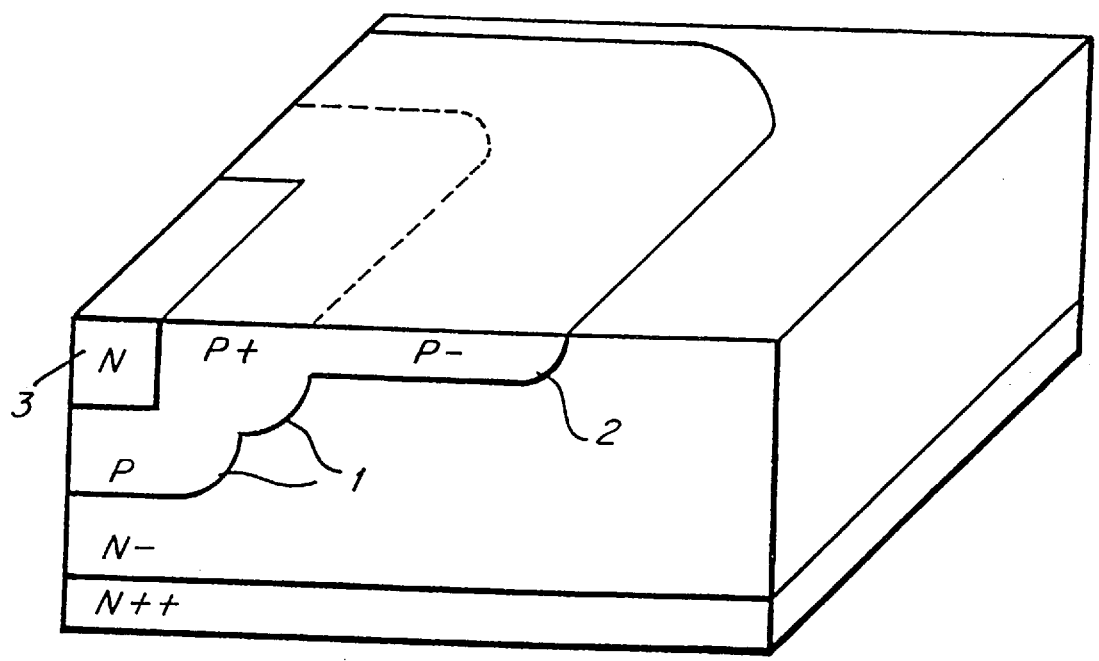
FIG. 3 shows a sectional view of a conventional solution for integrated structures that must withstand high substrate voltages.

FIG. 3 is a view of an integrated structure adapted to withstand high substrate voltages. In this case, the edge region 2 is connected to the P-type control region 1. The reference numeral 3 again designates an N-type region that provides the collector of a power device.

Figure 4:
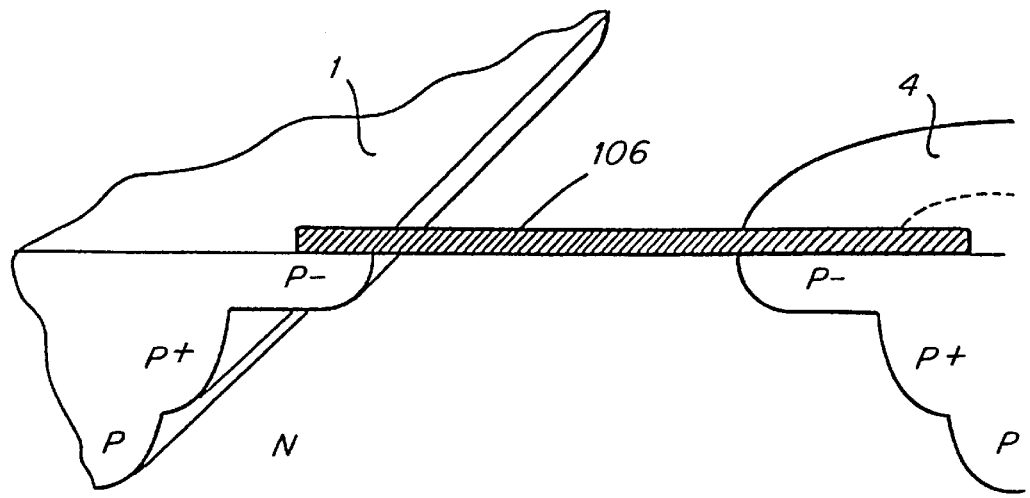
FIG. 4 shows a conventional solution for a power device, illustrating a first drawback thereof.

FIG. 4 is a view of the necessary connection, according to a conventional solution, between the high-voltage resistor 4 and the control region 1, which is provided by means of a field plate 106, in order to avoid the above mentioned drawbacks; however, this entails the problem of a considerable silicon area occupation.

Figure 5:
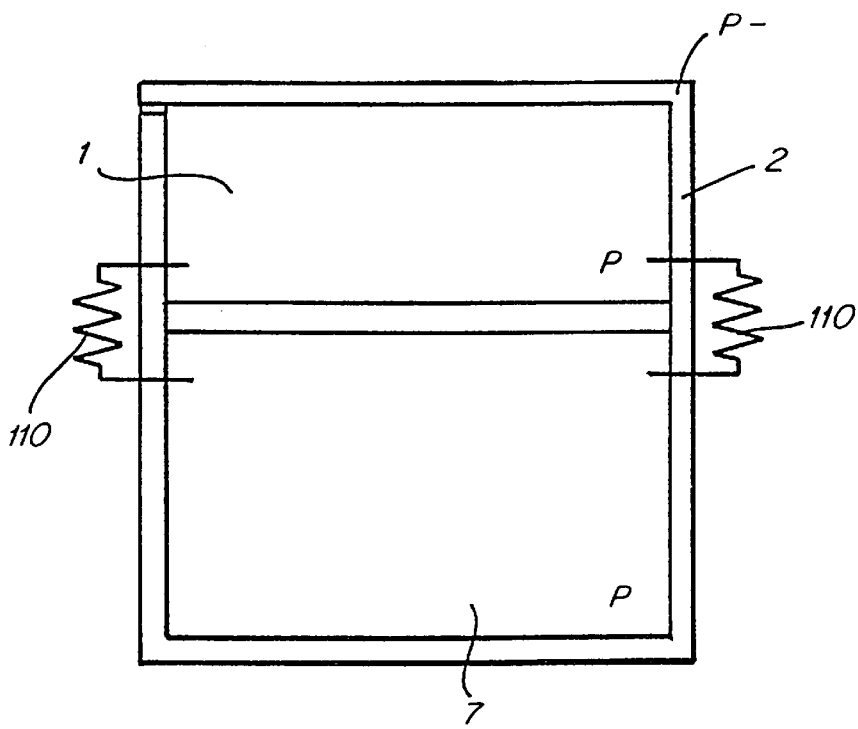
FIG. 5 shows a plan view of the integrated device according to the conventional solution, illustrating a second drawback.

FIG. 5 shows a drawback, described earlier, that arises from using the P-type ring as an edge. This drawback consists in essentially placing a resistor 110 between the P-type control region 1 and the P-type base region 7 of the power device, with a consequent loss of current. The edge region in this figure is designated by the reference numeral 2.

Figure 6:
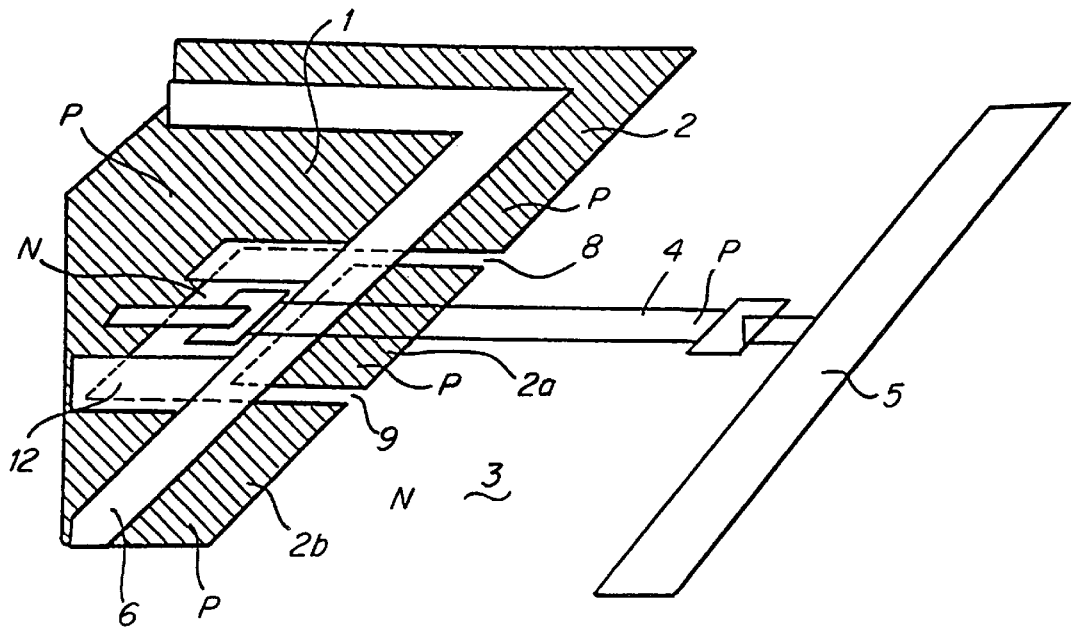
FIG. 6 shows a first embodiment of a monolithic semiconductor device having an edge structure according to an embodiment of the present invention.

FIG. 6 shows a preferred embodiment of the present invention. In this figure and in FIG. 7, elements that are similar to those shown in the preceding figures are given the same reference numerals. In this figure, the reference numeral 1 designates a control (linear) region that provides the control part of the device, the reference numeral 3 designates a region that provides the collector of the power device, which coincides with the substrate of the silicon plate and in which the potential can reach high voltage values, and the reference numeral 2 designates the edge region.

The high-voltage resistor 4 is integrated in the device by making it penetrate inside a U-shaped recess 12 formed in the control region 1. This recess has an N-type doping, since it is the same substrate region 3. Accordingly, it is not necessary to produce an edge for the terminal part of the resistor as shown in FIG. 4. The opposite end of the high-voltage resistor 4 is connected to the equipotential ring 5, which is at the same potential as the substrate.

The edge region is thus cut in two places, forming two channels 8 and 9 so as to form three contiguous edge regions 2, 2a, and 2b. The edge regions 2 and 2b (of the P type) are at the same potential as the control region 1, since they are still connected thereto, whereas the region 2a, which is also of the P type, is at the same potential as the high-voltage resistor 4 but is no longer connected to ground.

A ground-biased field plate 6 covers that portion of the N-type region 3 formed between the regions 1, 2a, and 4, so as to ensure its voltage withstanding ability. The field plate 6 is also arranged at the channels (cuts) 8 and 9 formed in the edge region 2 (2, 2a, and 2b) so as to avoid the escape of field lines at a high potential through the slits thus formed, with consequent increase of the electrical field at the surface and possibility of reaching the critical value.

The cuts 8 and 9 formed in the edge region, thereby forming regions 2, 2a, and 2b, prevent electrical continuity between the different regions, thus isolating the regions from each other but maintaining the structure functionality. N-type regions, i.e., regions having the same doping as the region 3, are provided inside the cuts 8 and 9. Circuitally, the two cuts 8 and 9 formed in the edge region are equivalent to causing the edge resistor, shown in FIG. 2, to have an infinite value, without however modifying the doping of said edge.

Figure 7:
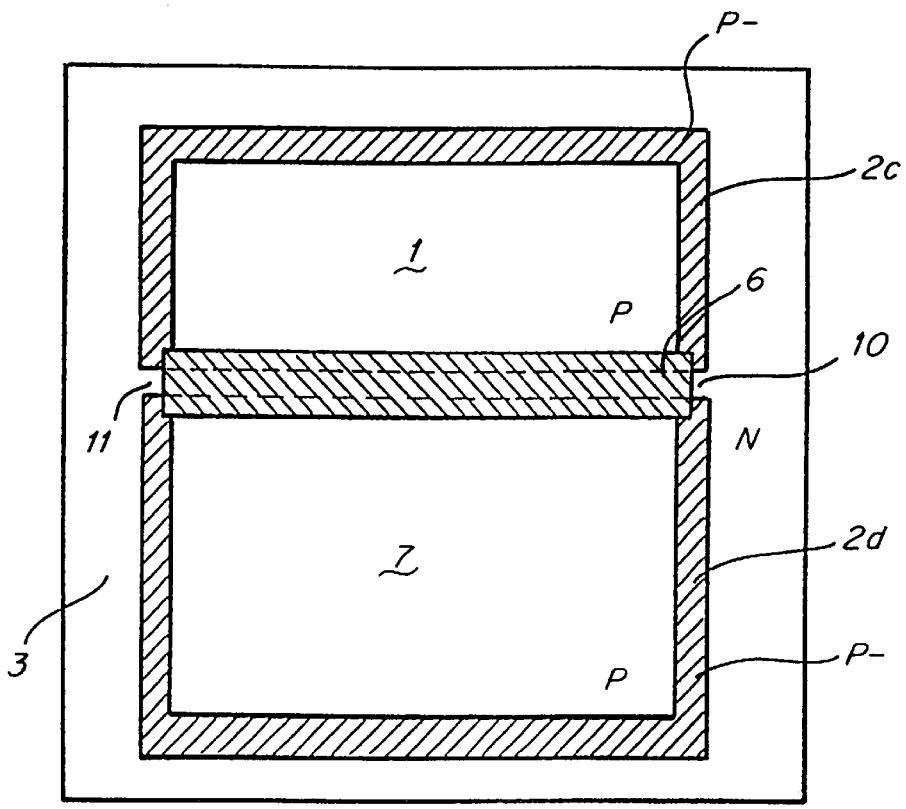
FIG. 7 shows a second embodiment of a monolithic semiconductor device having an edge structure according to an embodiment of the present invention.

FIG. 7 is a view of a second embodiment of the invention, which is adapted to overcome the above mentioned drawback, which relates to the use of a P-type edge ring. This use in fact entails the drawback of essentially placing a resistor between the P-type region that provides the control region and the P-type region that provides the base of the power device, with a consequent loss of current.

With the second embodiment, shown in FIG. 7, the isolation between the control region (linear region) 1 and the base region 7 of the power device is achieved by providing cuts on the region that forms the edge at the separation channel between the regions 1 and 7, so as to divide the edge into two regions 2c and 2d that are adjacent but electrically isolated. In this second embodiment, too, a field plate 6 has been used at the cuts 10 and 11.

By using the same process sequence used to integrate high-voltage and low-voltage components in power structures with vertical integration, it is possible to provide an open edge structure, as explained earlier, without introducing any additional operating stage.

In detail, the stages of the process are the following. First of all, the isolation region is formed; then the edge region is produced by implanting and diffusing P-type dopant together with the isolation. The configuration of the edge region is provided by producing cuts having appropriately chosen sizes. In particular, the width of each one of the cuts should be negligible with reference to the dimensions of the edge region.

The region that is opaque to the P-type implanting should have such dimensions as to prevent the occurrence of the electrical continuity of the edge ring by lateral diffusion, but at the same time should not allow the field lines to affect the surface regions. Therefore, the cut should be more than twice as large as the lateral diffusion of the edge layer.

An N-type implanting stage, performed in the region that is opaque to the P-type edge implanting and before forming the region 1, improves the isolation between the edge regions 2, 2a, and 2b. This N-type implanting also reduces the depletion in the cutting region along the junction between the regions 2 and the region 3, preventing lateral punch-through phenomena from altering the operation of the structure.

In practice it has been observed that the edge structure according to the invention and the method for producing said structure fully achieve the intended aim, since said structure, executed with the method described above, allows giving the edge resistor an infinite value without altering the doping level of said edge, thus providing a division of the substrate voltage even when the operating voltages are very high.

As shown, the method for providing said edge structure can also be easily executed, since it is possible to perform the above mentioned cuts in the edge structure without having to resort to additional stages with respect to those normally used.

The edge structure thus conceived is susceptible of numerous modifications and variations, all of which are intended to be within the scope of the inventive concept. In practice, the materials employed, so long as they are compatible with the specific use, as well as the dimensions, may be any according to the requirements and the state of the art.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method of producing a monolithic semiconductor device having an edge structure and integrating low-voltage and high-voltage components, the method comprising the steps of:
    forming an isolation region to delimit a first region that contains the high-voltage components from a second region that contains the low-voltage components;
    implanting and diffusing P-type dopant to provide an edge region;
    forming at least one channel in the edge region where the P-type dopant is not implanted and diffused;
    implanting N-type dopant in the at least one channel; and
    forming a control region.

2. The method of claim 1, wherein the step of forming the at least one channel includes a step of forming two channels.

3. The method of claim 2, wherein the step of forming the at least one channel includes forming channels having a width that is greater than twice a lateral diffusion of the edge region.

* * * * *

UNITED STATES PATENT AND TRADEMARK OFFICE
CERTIFICATE OF CORRECTION

PATENT NO. : 5,830,783
DATED : November 3, 1998
INVENTOR(S): Natale Aiello, Atanasio LaBarbera and Salvatore Leonardi It is certified that error appears in the above-identified patent and that said Letters Patent is hereby corrected as shown below:

On the title page: Item

[73] assignee: Consorzio per la Ricerca sulla Microelettronica nel Mezzogiorno

Signed and Sealed this

Second Day of February, 1999

Attest:

Attesting Officer

*Acting Commissioner of Patents and Trademarks*